United States Patent
Hsu et al.

(10) Patent No.: US 9,390,816 B2
(45) Date of Patent: *Jul. 12, 2016

(54) INTEGRATED CIRCUIT HAVING VOLTAGE MISMATCH REDUCTION

(71) Applicant: TAIWAN SEMICONDUCTOR MANUFACTURING COMPANY, LTD., Hsinchu (TW)

(72) Inventors: Yu-Hao Hsu, Tainan (TW); Chia-En Huang, Xinfeng Township (TW); Hektor Huang, New Taipei (TW); Yi-Ching Chang, Taichung (TW); Chen-Lin Yang, Zhubei (TW); Jung-Ping Yang, Jui-bei (TW); Cheng Hung Lee, Hsinchu (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/980,250

(22) Filed: Dec. 28, 2015

(65) Prior Publication Data

US 2016/0133342 A1    May 12, 2016

Related U.S. Application Data

(63) Continuation of application No. 14/539,298, filed on Nov. 12, 2014, now Pat. No. 9,240,233.

(51) Int. Cl.
| | | |
|---|---|---|
| G11C 11/00 | (2006.01) |
| G11C 29/00 | (2006.01) |
| G11C 11/419 | (2006.01) |
| G11C 11/417 | (2006.01) |

(52) U.S. Cl.
CPC ............ *G11C 29/702* (2013.01); *G11C 11/417* (2013.01); *G11C 11/419* (2013.01)

(58) Field of Classification Search
CPC .. G11C 11/412; G11C 11/413; H01L 27/1104
USPC .................................................. 365/154, 156
See application file for complete search history.

(56) References Cited

U.S. PATENT DOCUMENTS

| 9,240,233 B1 * | 1/2016 | Hsu .................... G11C 11/419 |
| 2009/0161412 A1 | 6/2009 | Suzuki |
| 2010/0296334 A1 | 11/2010 | Houston |

* cited by examiner

*Primary Examiner* — Huan Hoang
(74) *Attorney, Agent, or Firm* — Hauptman Ham, LLP

(57) ABSTRACT

An integrated circuit has a first circuit portion on a first level and a second circuit portion on a second level different from the first level. The first circuit portion includes a first cell having a first voltage value at a first node and a second voltage value at a second node. The second circuit portion includes a second cell coupled with the first cell, the second cell being selectively controllable to supply a voltage to the first cell based on an instruction to supply the voltage. The instruction to supply the voltage is based on a determined mismatch between the first voltage value and the second voltage value being greater than a predetermined threshold value.

20 Claims, 9 Drawing Sheets

INTEGRATED CIRCUIT HAVING VOLTAGE MISMATCH REDUCTION

PRIORITY CLAIM

The present application is a continuation of U.S. application Ser. No. 14/539,298, filed Nov. 12, 2014, which is incorporated herein by reference in its entirety.

BACKGROUND

Some semiconductor devices have circuit portions that fail for a number of reasons such as, but not limited to, a voltage mismatch between one node and another node where a voltage value at each of the nodes is supposed to be about equal. Some semiconductor devices include redundancy circuits to repair a determined voltage mismatch.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
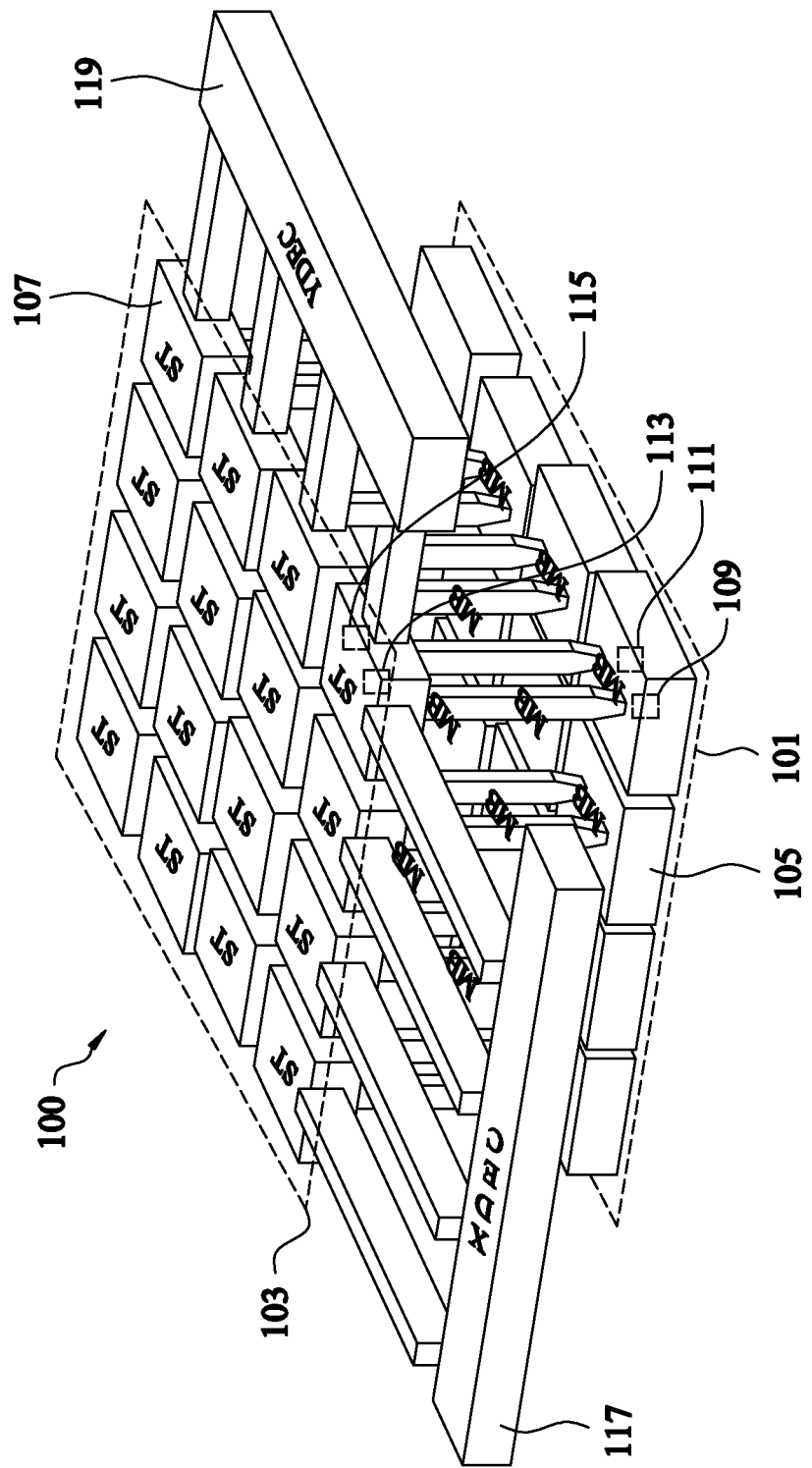
FIG. 1 is a diagram of an integrated circuit, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some semiconductor devices have circuit portions that fail, because a voltage mismatch between one node and another node where a voltage value at each of the nodes is supposed to be about equal occurs. Mismatched voltages between certain nodes in an integrated circuit sometimes increase an amount of power consumed by the semiconductor device during operation. Sometimes, mismatched voltages reduce performance capabilities, such as processing speed capabilities, of the semiconductor device.

Some semiconductor devices include redundancy circuits to repair a determined voltage mismatch. Redundancy circuits serve as backup circuits that are substituted for a circuit portion that fails or in which there is a determined voltage mismatch. Redundancy circuits, however, are associated with area penalties, performance penalties, and power penalties. In other words, redundancy circuits often increase an area occupied by a circuit portion over a substrate, reduce processing speed capabilities of the semiconductor device, and increase power consumption of the semiconductor device.

Some semiconductor devices are configured to apply a stress voltage to repair or correct a voltage mismatch between one node and another node. Such semiconductor devices, however, are not configured to repair individual cells of a semiconductor device within which a voltage mismatch occurs. Rather, semiconductor devices that are configured to apply a stress voltage are configured to globally apply the stress voltage to all of the cells that are included in the semiconductor device. Because of the potential problems that could occur if a voltage mismatch exists, some semiconductor devices are designed having a wide range within which an allowable voltage mismatch may fall to ensure a production yield without the semiconductor devices falling out of spec or being defective. But, a wide allowable voltage mismatch range increases a minimum operating voltage of the semiconductor device, reduces performance capabilities of the semiconductor device, and potentially increases an overall area of a substrate consumed by the semiconductor device.

Some semiconductor devices that include a plurality of bit cells arranged in columns and rows include two dimensional redundancy columns or rows that are capable of repairing one or two bits or circuit portions that fail. But, an additional redundant column or row increases the area over the substrate covered by the semiconductor device. Inclusion of redundant columns and/or rows reduces processing performance, because the semiconductor device includes extra gates, which increases processing times by introducing additional gate delays. Redundant columns and/or rows also and increases setup times, for example, after a device that uses such a semiconductor device wakes up from a power management mode.

FIG. 1 is a diagram of an integrated circuit 100, in accordance with one or more embodiments. Integrated circuit 100 is a three-dimensional, multi-level, circuit that is capable of performing 1-by-1 cell or circuit portion repair, in real-time, in the event that a voltage mismatch exists between certain nodes within one or more cells of the integrated circuit 100.

Integrated circuit 100 comprises a first circuit portion 101 on a first level and a second circuit portion 103 on a second level different from the first level such that the second circuit portion 103 is over the first level. In some embodiments, the second circuit portion 103 is below the first level. The first circuit portion 101 is a core or SRAM macro layer, for example, and the second circuit portion 103 is a stressing layer that includes one or more input/output devices.

The first circuit portion 101 comprises a plurality of first cells 105, and the second circuit portion 103 comprises a plurality of second cells 107. In some embodiments, the first cells 105 comprise bit cells. In some embodiments, the first cells 105 comprise sense amplifiers. In some embodiments, the first cells 105 comprise a combination of sense amplifiers and bit cells, or other suitable circuits. Each first cell 105 of the plurality of first cells 105 comprises a first transistor 109 which, in use, is configured to have a first voltage value V1 at a first node N1 (see FIG. 2). Each first cell 105 of the plurality of first cells 105 also comprises a second transistor 111 which, in use, is configured to have a second voltage value V2 at a second node N2 (see FIG. 2).

The second cells 107 of the plurality of second cells 107 are individually coupled with a corresponding first cell 105 of the plurality of first cells 105. In some embodiments, the first cells 105 of the plurality of first cells 105 being on a different level compared to the second cells 107 of the plurality of second cells 107 makes it possible to cross couple stressing nodes (i.e., nodes of the second cells 107 that are controllable to selectively supply a voltage) with the first node N1 and the second node N2 in a three-dimensional integrated circuit (3DIC) for 3D stressing. The second cells 107 of the plurality of second cells 107 are selectively controllable to supply a voltage V3 to one or more of the first cells 105 of the plurality of first cells 105 based on an instruction to supply the voltage V3. The second cells 107 supply the voltage V3 to a corresponding first cell 105 in a 1-to-1 relationship for real-time repair of the corresponding first cell 105. In some embodiments, the voltage V3 is supplied from an activated second cell 107 to stress the corresponding first cell 105 on demand without supplying the voltage V3 to the other first cells 105 of the plurality of first cells 105.

The instruction to supply the voltage V3 is based on a determination that a mismatch between the first voltage value V1 and the second voltage value V2 exists and that the mismatch is greater than a predetermined threshold value. The predetermined threshold value is an absolute value of a determined difference between the first voltage value V1 and the second voltage value V2. If the determined mismatch between the first voltage value V1 and the second voltage value V2 is greater than the predetermined threshold value, the determined mismatch between the first voltage value V1 and the second voltage value V2 is outside an allowable range. If the determined mismatch is outside the allowable range, a minimum operating voltage of the first cell 105 increases to a point at which the performance of the integrated circuit 100, or at least the first cell 105, falls outside a designed operating specification, which reduces processing speed capabilities of the integrated circuit 100 and/or increases power consumption. As such, if a determined mismatch between the first voltage value V1 and the second voltage value V2 is greater than the predetermined threshold value, then the voltage V3 is supplied to repair the first cell 105 that has the determined voltage mismatch. The supplied voltage V3 reduces the determined voltage mismatch such that the mismatch is less than the predetermined threshold value. In some embodiments, the reduction of the determined voltage mismatch is a tuning of the determined voltage mismatch. If the mismatch is reduced, a voltage threshold value Vth of the first circuit portion 101 is increased, and a minimum operating voltage value Vmin of the first circuit portion 101 is decreased.

The second cells 107 of the plurality of second cells 107 each comprise a third transistor 113 and a fourth transistor 115. The third transistor 113 is coupled with the first transistor 109 of a corresponding first cell 105 of the plurality of first cells 105. The fourth transistor 115 is coupled with the second transistor 111 of the corresponding first cell 105 of the plurality of first cells 105. The third transistor 113 and the fourth transistor 115 are configured to be selectively turned on or off to supply the voltage V3 to the corresponding first cell 105 of the plurality of first cells 105. The second cells 107 of the plurality of second cells 107 are coupled with an x-decoder 117 and a y-decoder 119 to receive an instruction from a processor to turn the third transistor 113 and/or the fourth transistor 115 on or off.

The first cells 105 of the plurality of first cells 105 have a first quantity of first cells 105. The second cells 107 of the plurality of second cells 107 have a second quantity of second cells 107 equal to the first quantity. The first circuit portion 101 has a first surface area in a first plane and the second circuit portion 103 has a second surface area in a second plane parallel to the first plane. The first surface area of the first circuit portion 101 is equal to the second surface area of the second circuit portion 103. In some embodiments, the first surface area of the first circuit portion 101 is different from the second surface area of the second circuit portion 103. The integrated circuit 100 having the first circuit portion 101 on a different level compared with the second circuit portion 103, provides the ability to stress the first node N1 and/or the second node N2 and avoids increasing an amount of surface area of a substrate over which the first circuit portion 101 is formed.

The first circuit portion 101 is manufactured in compliance with a first set of process design rules such that the first cells 105 of the plurality of first cells 105 have a layout in compliance with the first set of design rules. The second circuit portion 103 is manufactured in compliance with a second set of process design rules such that the second cells 107 of the plurality of second cells 107 have a layout in compliance with the second set of design rules. In some embodiments, the first set of process design rules is equal to the second set of process design rules, meaning that the first circuit portion 101 and the second circuit portion 103 are capable of being formed by identical or similar processes. In some embodiments, the first set of process design rules is different from the second set of process design rules. For example, in some embodiments, the first circuit portion 101 is manufactured in compliance with design rules associated with a 10 nanometer manufacturing process while the second circuit portion 103 is manufactured in compliance with design rules associated with a high voltage process. In some embodiments, the first circuit portion 101 and the second circuit portion 103 comprise different combinations of materials. Such variation in manufacturing between the first circuit portion 101 and the second circuit portion 103 makes it possible to reduce the costs associated with manufacturing the integrated circuit 100, because an integrated circuit formed in compliance with a 10 nanometer manufacturing process is more expensive than one formed in compliance with a high voltage manufacturing process.

In some embodiments, the first circuit portion 101 is formed over a first substrate and the second circuit portion 103 is formed over a second substrate different from the first substrate. By forming the first circuit portion 101 and the second circuit portion 103 over different substrates, in some embodiments, conflicts that could occur between the manufacturing processes of the first circuit portion 101 and the second circuit portion 103 are avoided or minimized. Such conflicts could cause device defects that are detrimental to the performance capabilities of the integrated circuit 100.

Figure 2:
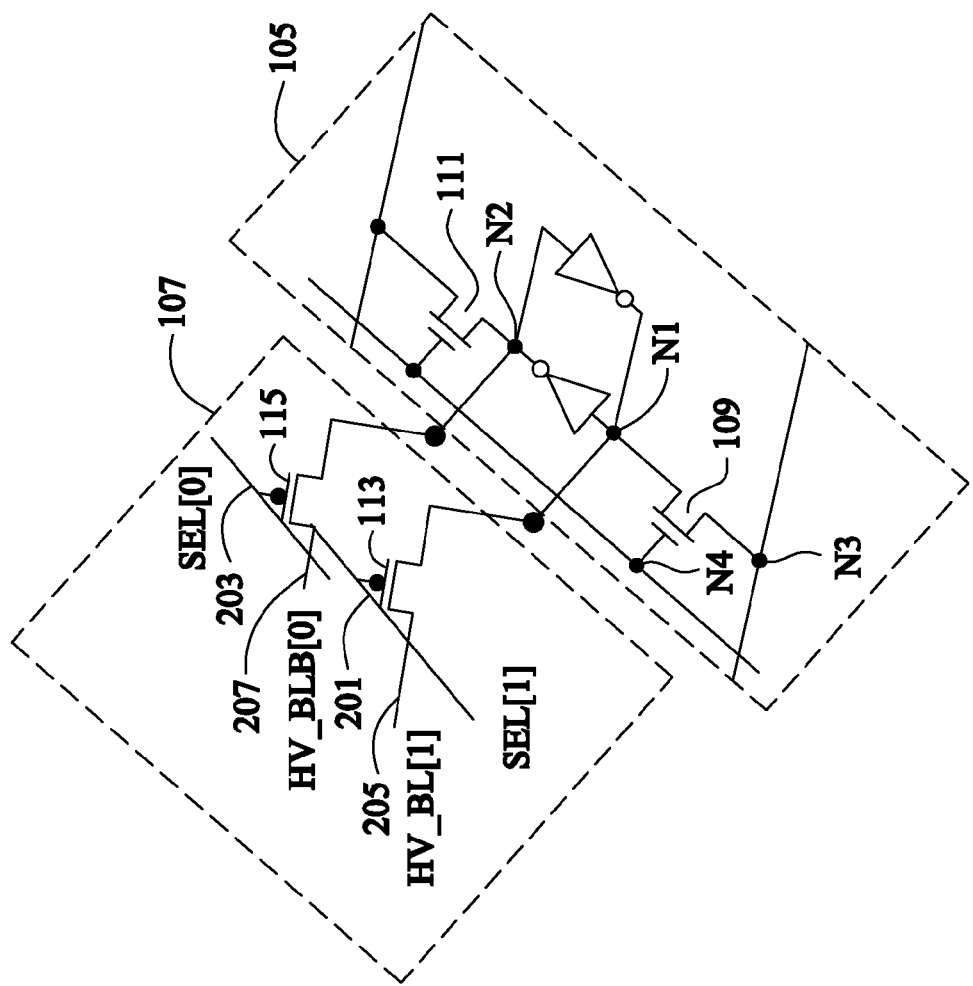
FIG. 2 is a schematic diagram of a first cell coupled with a second cell, in accordance with one or more embodiments.

FIG. 2 is a schematic diagram of a first cell 105 coupled with a second cell 107, in accordance with one or more embodiments. The third transistor 113 is coupled with the first transistor 109 at first node N1. The fourth transistor 115 is coupled with the second transistor 111 at second node N2. If a voltage mismatch exists between the first voltage V1 at the first node N1 and the second voltage V2 at the second node N2, and that voltage mismatch is greater than the predetermined threshold value, then one or more of the third transistor 113 or the fourth transistor 115 is turned on in accordance with an instruction received by way of the x-decoder 117 (FIG. 1) and/or the y-decoder 119 (FIG. 1). In some embodiments, the instruction is generated by control signals and corresponding decoders other than an x-decoder and a y-decoder. The x-decoder 117 is, for example, coupled with the third transistor 113 by way of a first word line 201 and the fourth transistor 115 by way of a second word line 203. The y-decoder 119 is coupled with the third transistor 113 by way of a first bit line 205 and the fourth transistor 115 by way of a second bit line 207. Second bit line 207 is a bit line bar. In some embodiments, the described connectivity of the x-decoder 117 and the y-decoder 119 are reversed.

The third transistor 113 and the fourth transistor 115 are stressor transistors that supply the voltage V3 to one or more of first node N1 or second node N2 to repair a determined voltage mismatch by stressing the first transistor 109 and/or or the second transistor 111 at the first node N1 and/or the second node N2 to tune the voltage mismatch such that the voltage value V1 at first node N1 is closer to the voltage value V2 at second node N2. Because the voltage values V1, V2 are selectively tunable if a voltage mismatch is greater than the predefined threshold value, design windows that provide a factor of safety can be minimized, which reduces the minimum operating voltage Vmin of the integrated circuit 100 (FIG. 1).

The first transistor 109 and the second transistor 111 each have a source, a drain, and a gate. First node N1, for example, is on one of the source or the drain side of the first transistor 109. A third node N3 is on the other of the source or the drain side of the first transistor 109. A fourth node N4 is on the gate of the first transistor 109. Like the first node N1, the third node N3 has a determinable voltage value V4 and the fourth node N4 has a determinable voltage value V5. A ratio of V1:V5:V4 changes with the stressing of the first transistor 109 (i.e., by supplying the voltage V3). For example, if the ratio of V1:V5:V4 is 2:2:1 before stressing the first transistor 109 by supplying the voltage V3 to first node N1, the ratio of V1:V5:V4 potentially changes to 2:1.5:1 when the voltage V3 is supplied to the first node N1, thereby stressing the first transistor 109. In some embodiments, the ratio of V1:V5:V4 is represented by the ratio Q:R:S, where Q ranges from 0 to about 5, R ranges from 0 to about 5 and S ranges from 0 to about 5. The second transistor 111 is stressed by supplying the voltage V3 to the second node N2 via the fourth transistor 115.

In some embodiments, electrical products such as handheld or mobile devices comprise the integrated circuit 100. Such devices are configured to detect a voltage mismatch in an SRAM such as the integrated circuit 100, for example, by a built-in-self-test (BIST). The BIST is configured to detect the voltage mismatch or a high $vcc_{min}$ caused by aging, a particle emission, or other suitable instigator. The electrical product, by way of an operating system (OS) or corresponding application drivers executed by a processor, is configured to selectively supply the stressing voltage on-demand to reduce or eliminate the voltage mismatch.

Figure 3:
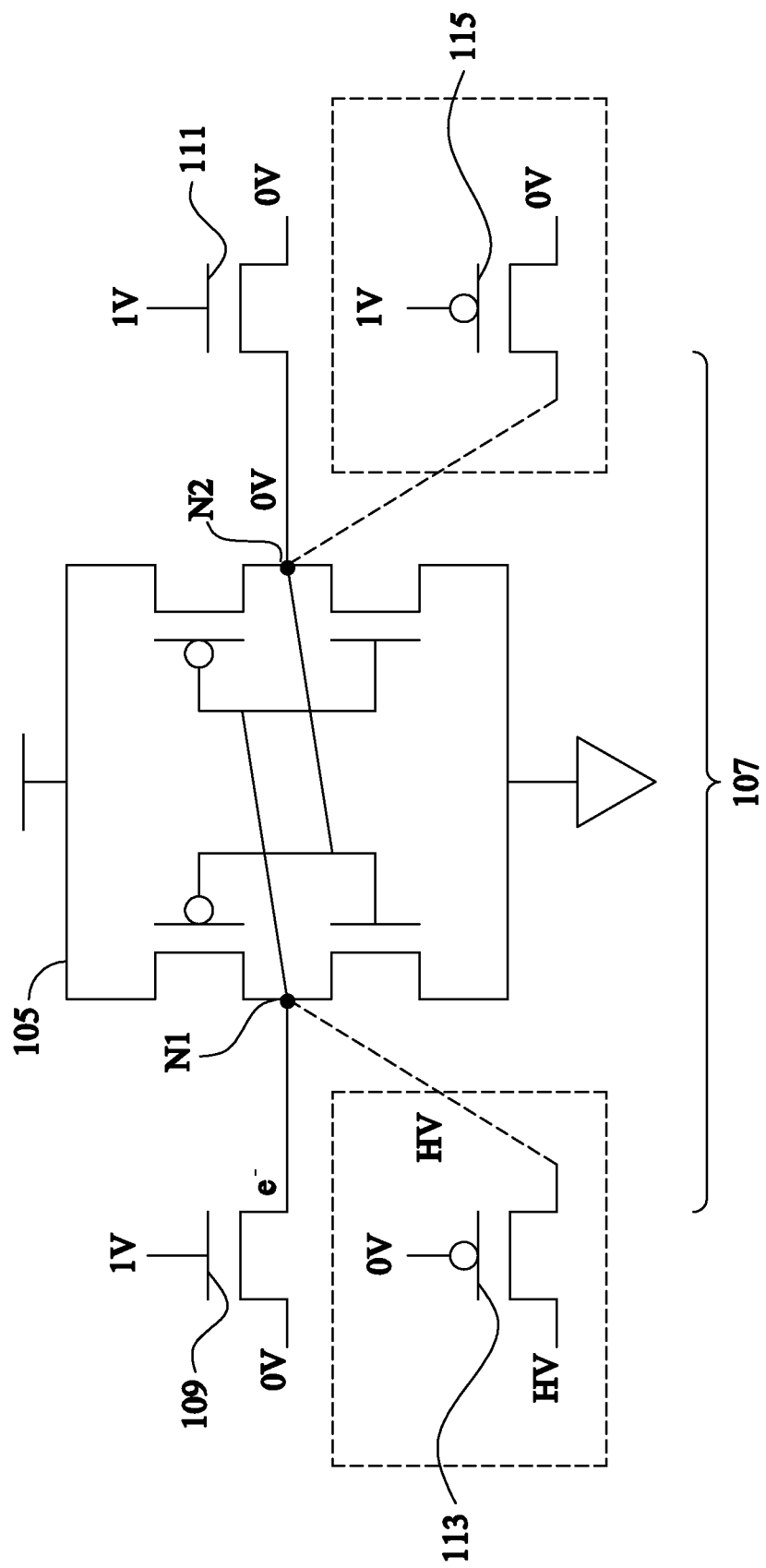
FIG. 3 is a schematic diagram of a first cell coupled with a second cell, in accordance with one or more embodiments.

FIG. 3 is a schematic diagram of a first cell 105 coupled with a second cell 107, in accordance with one or more embodiments. First cell 105 is a six transistor SRAM bit cell. The first transistor 109 is stressed by the third transistor 113. The second transistor 111 is not stressed, in this example, by the fourth transistor 115. But in some embodiments, it is the third transistor 113 that supplies the voltage V3 to first node N1, which traps electrons e⁻ between the first transistor 109 and the first node N1, which stresses the first transistor 109 and reduces the voltage mismatch between first node N1 and second node N2.

Figure 4:
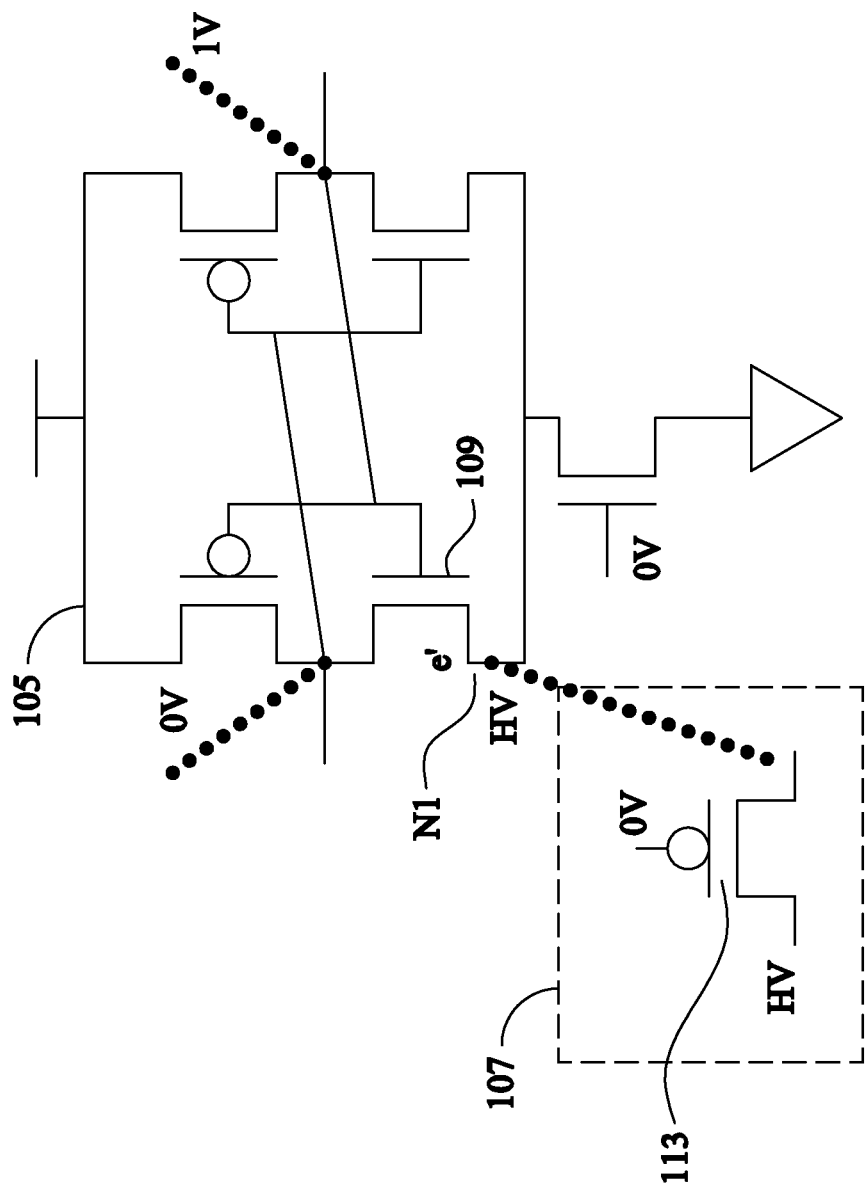
FIG. 4 is a schematic diagram of a first cell coupled with a second cell, in accordance with one or more embodiments.

FIG. 4 is a schematic diagram of a first cell 105 coupled with a second cell 107, in accordance with one or more embodiments. First cell 105 is a sense amplifier. The first transistor 109 is stressed by the third transistor 113. The third transistor 113 supplies the voltage V3 to first node N1, which traps electrons e⁻ between the first transistor 109 and the first node N1. The threshold voltage Vth of the first transistor 109 is increased by the supplied voltage V3.

Figure 5:
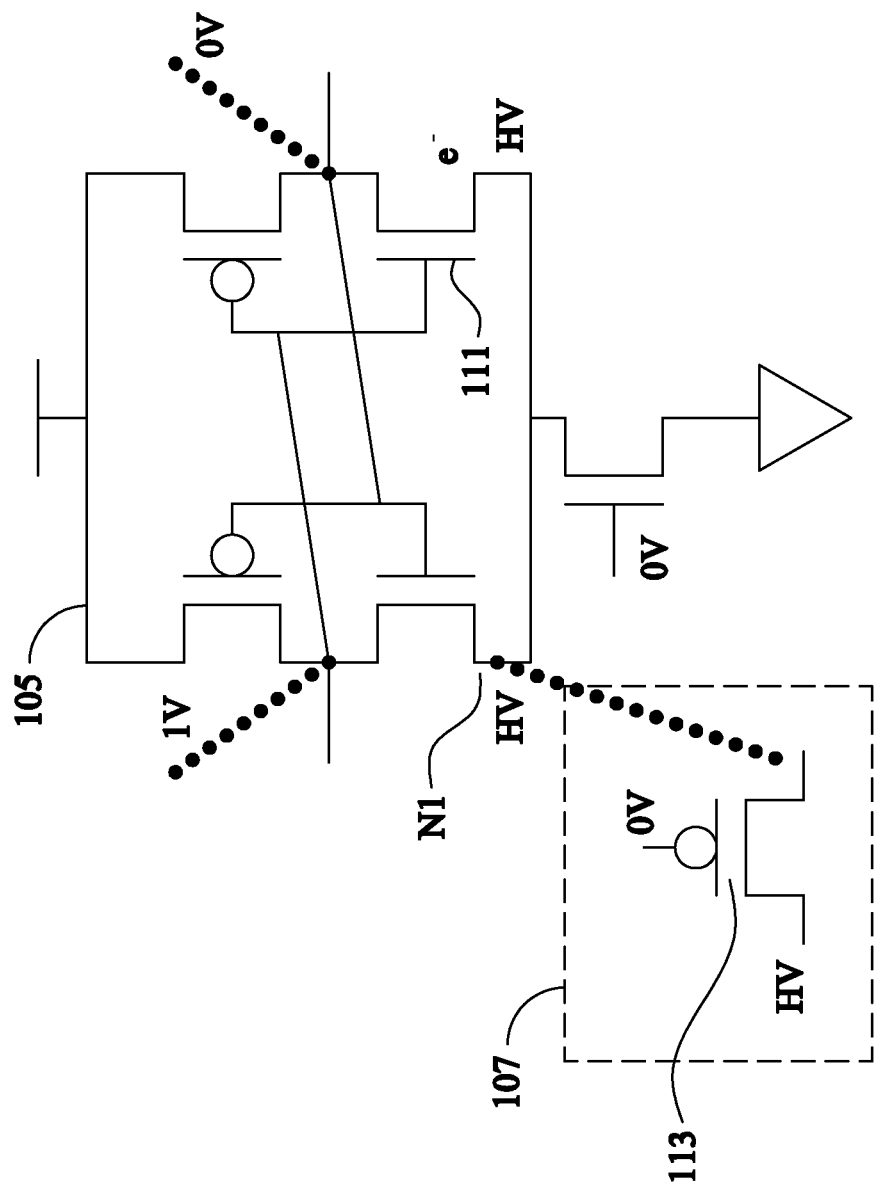
FIG. 5 is a schematic diagram of a first cell coupled with a second cell, in accordance with one or more embodiments.

FIG. 5 is a schematic diagram of a first cell 105 coupled with a second cell 107, in accordance with one or more embodiments. First cell 105 is a sense amplifier. The second transistor 111 is stressed by the third transistor 113. The third transistor 113 supplies the voltage V3 to first node N1, which traps electrons e⁻ between the second transistor 111 and the first node N1. The threshold voltage Vth of the second transistor 111 is increased by the supplied voltage V3.

Figure 6:
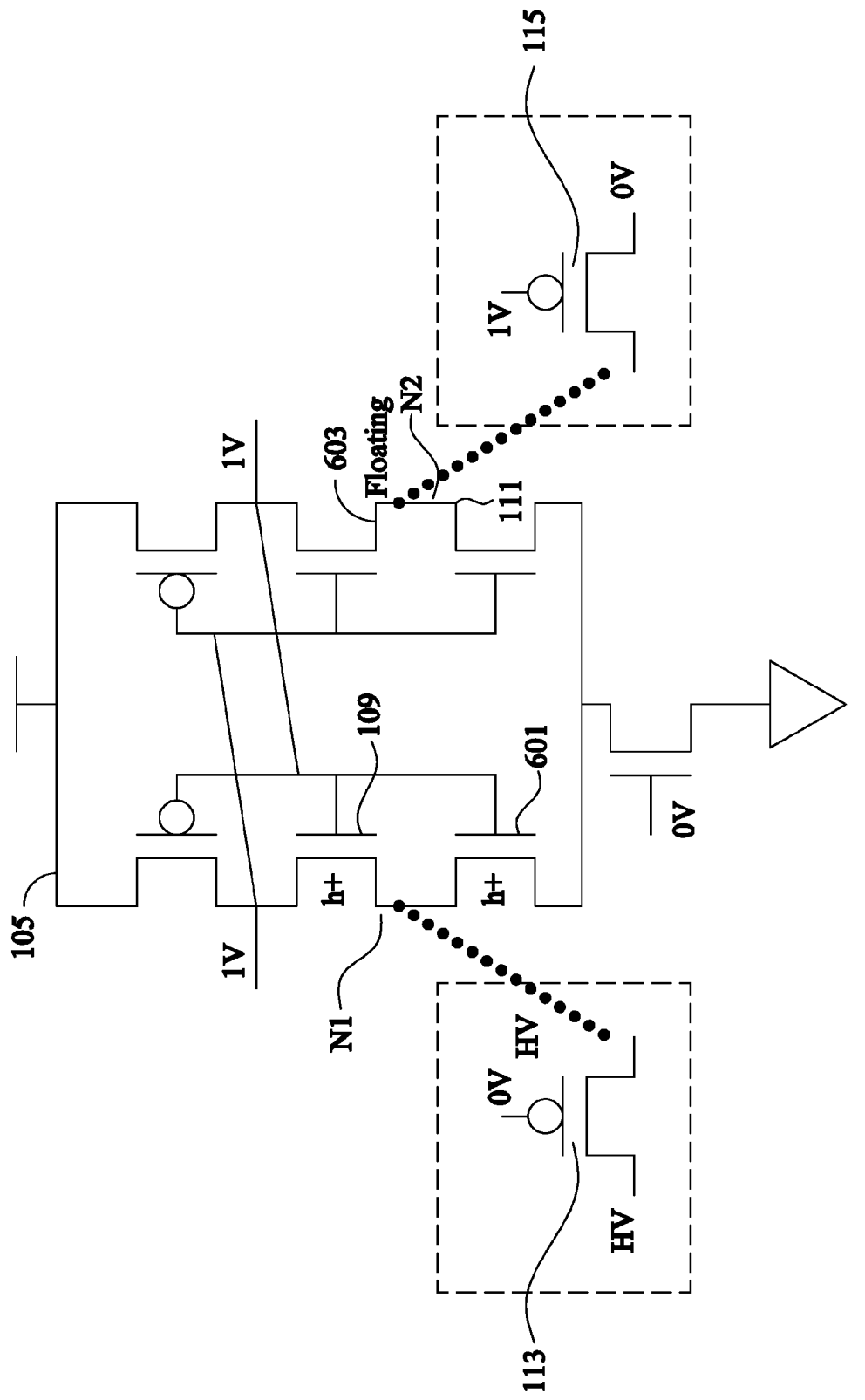
FIG. 6 is a schematic diagram of a first cell coupled with a second cell, in accordance with one or more embodiments.

FIG. 6 is a schematic diagram of a first cell 105 coupled with a second cell 107, in accordance with one or more embodiments. First cell 105 is a sense amplifier. The first cell 105 includes at least the first transistor 109, the second transistor 111, a fifth transistor 601 and a sixth transistor 603. The first transistor 109 is stressed by the third transistor 113. The second transistor 111 is not stressed, in this example, by the fourth transistor 115. The third transistor 113 supplies the voltage V3 to first node N1, which raises the threshold voltage Vth of the first transistor 109 and the fifth transistor 601. The second node N2 is floating while the first node N1 is under stress via the voltage V3 supplied to the first node N1.

Figure 7:
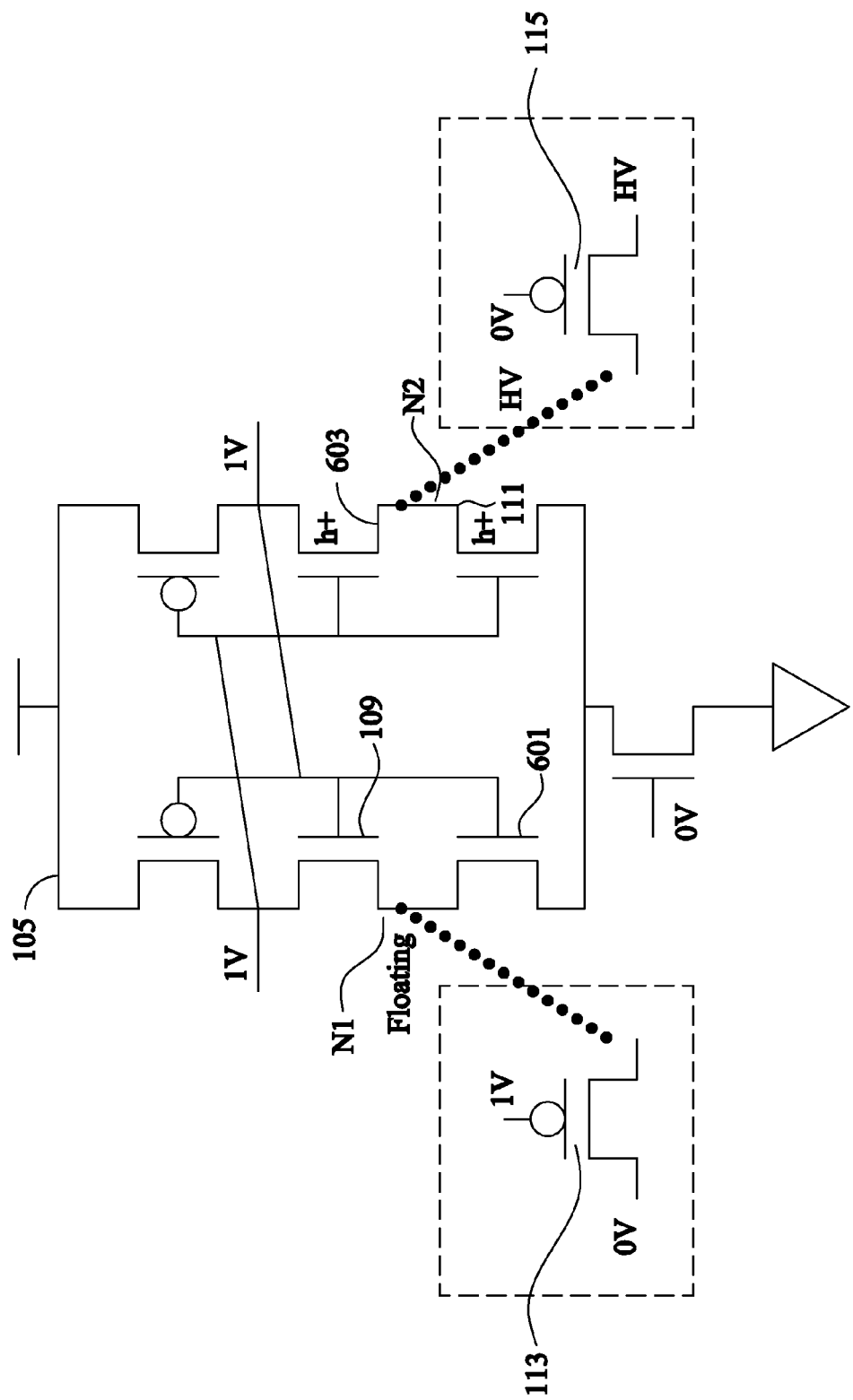
FIG. 7 is a schematic diagram of a first cell coupled with a second cell, in accordance with one or more embodiments.

FIG. 7 is a schematic diagram of a first cell 105 coupled with a second cell 107, in accordance with one or more embodiments. First cell 105 is a sense amplifier. The first cell 105 includes at least the first transistor 109, the second transistor 111, a fifth transistor 601 and a sixth transistor 603. The second transistor 111 is stressed by the fourth transistor 115. The first transistor 109 is not stressed, in this example, by the third transistor 113. The fourth transistor 115 supplies the voltage V3 to second node N2, which raises the threshold voltage Vth of the second transistor 111 and the sixth transistor 603. The first node N1 is floating while the second node N2 is under stress via the voltage V3 supplied to the second node N2.

Figure 8:
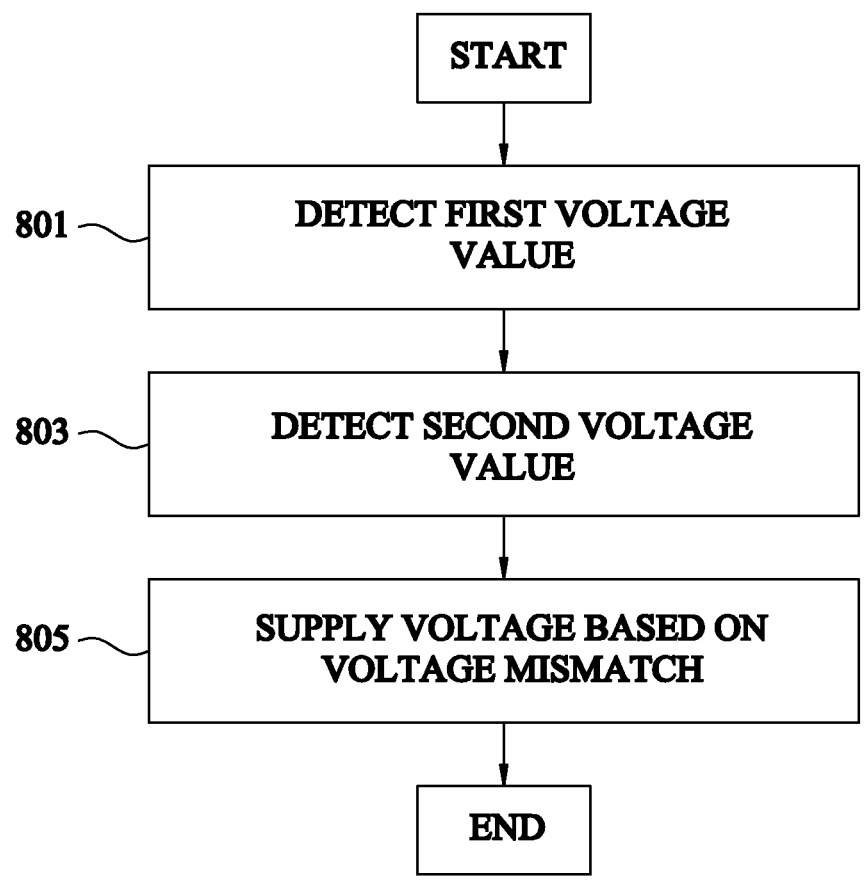
FIG. 8 is a flowchart of a method of reducing a voltage mismatch in an integrated circuit, in accordance with one or more embodiments.

FIG. 8 is a flowchart of a method 800 of reducing a voltage mismatch in an integrated circuit, in accordance with one or more embodiments.

In step 801, a processor coupled with an integrated circuit, such as integrated circuit 100 (FIG. 1), detects a first voltage value at a first node of a first transistor in a first cell of a plurality of first cells of a first circuit portion of the integrated circuit.

In step 803, the processor detects a second voltage value at a second node of a second transistor in the first cell of the plurality of first cells of the first circuit portion of the integrated circuit.

In step 805, the processor causes a voltage to be supplied to at least one of the first node or the second node based on a determination that a mismatch between the first voltage value and the second voltage value is greater than a predetermined threshold value.

Figure 9:
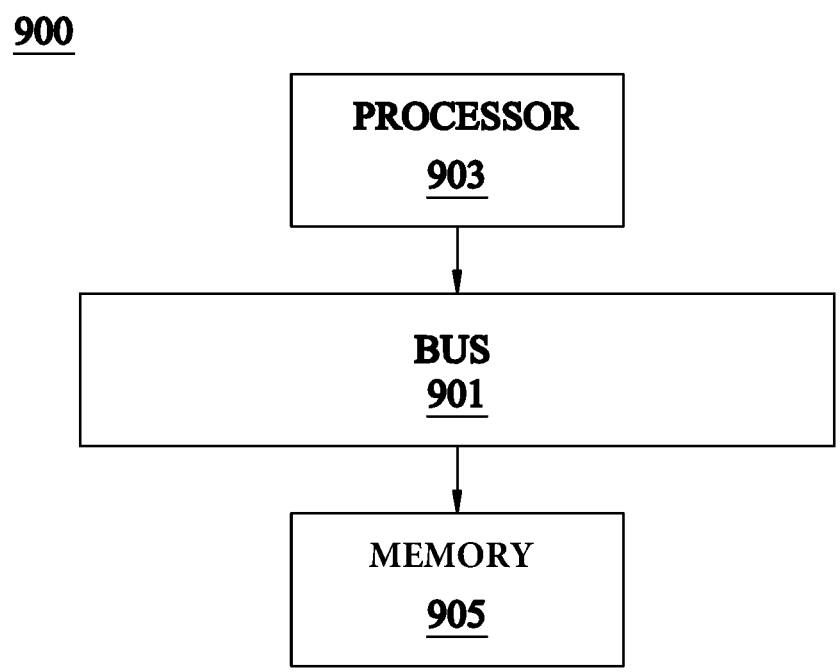
FIG. 9 is a diagram of a chipset by which an embodiment is implemented, in accordance with one or more embodiments.

FIG. 9 is a functional block diagram of a computer or processor-based system 900 upon which or by which an embodiment is implemented. In some embodiments, the processor-based system 900 is coupled with the integrated circuit 100 (FIG. 1).

Processor-based system 900 is programmed to reduce a determined voltage mismatch, as described herein, and includes, for example, bus 901, processor 903, and memory 905 components.

In some embodiments, the processor-based system is implemented as a single "system on a chip." Processor-based system 900, or a portion thereof, constitutes a mechanism for reducing a determined voltage mismatch.

In some embodiments, the processor-based system 900 includes a communication mechanism such as bus 901 for transferring information and/or instructions among the components of the processor-based system 900. Processor 903 is connected to the bus 901 to obtain instructions for execution and process information stored in, for example, the memory 905. In some embodiments, the processor 903 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 903. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 903 performs a set of operations on information as specified by a set of instructions stored in memory 905 related to reducing a determined voltage mismatch. The execution of the instructions causes the processor to perform specified functions.

The processor 903 and accompanying components are connected to the memory 905 via the bus 901. The memory 905 includes one or more of dynamic memory (e.g., RAM, magnetic disk, writable optical disk, etc.) and static memory (e.g., ROM, CD-ROM, etc.) for storing executable instructions that when executed perform the steps described herein to reduce a determined voltage mismatch. The memory 905 also stores the data associated with or generated by the execution of the steps.

In one or more embodiments, the memory 905, such as a random access memory (RAM) or any other dynamic storage device, stores information including processor instructions for reducing a determined voltage mismatch. Dynamic memory allows information stored therein to be changed. RAM allows a unit of information stored at a location called a memory address to be stored and retrieved independently of information at neighboring addresses. The memory 905 is also used by the processor 903 to store temporary values during execution of processor instructions. In various embodiments, the memory 905 is a read only memory (ROM) or any other static storage device coupled to the bus 901 for storing static information, including instructions. Some memory is composed of volatile storage that loses the information stored thereon when power is lost. In some embodiments, the memory 905 is a non-volatile (persistent) storage device, such as a magnetic disk, optical disk or flash card, for storing information, including instructions, that persists even when the process-based system 900 is turned off or otherwise loses power.

The term "computer-readable medium" as used herein refers to any medium that participates in providing information to processor 903, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

In some embodiments, an integrated circuit comprises a first circuit portion on a first level, the first circuit portion comprising a first cell configured to have a first voltage value at a first node and a second voltage value at a second node. The integrated circuit further comprises a second circuit portion on a second level different from the first level, the second circuit portion comprising a second cell coupled with the first cell, the second cell being selectively controllable to supply a voltage to the first cell based on an instruction to supply the voltage. The instruction to supply the voltage is based on a determined mismatch between the first voltage value and the second voltage value being greater than a predetermined threshold value.

In some embodiments, an apparatus comprises a memory including computer program code for one or more programs and a processor configured to execute an instruction from the memory. The instruction causes the apparatus to detect a first voltage value at a first node of a first cell of a first circuit portion, the first circuit portion being on a first level of an integrated circuit, detect a second voltage value at a second node of the first cell, and, based on a determined mismatch between the first voltage value and the second voltage value being greater than a predetermined threshold value, instruct a second cell to supply a voltage to the first cell. The second cell belongs to a second circuit portion on a second level different from the first level.

In some embodiments, a method comprises detecting a first voltage value at a first node of a first cell of a first circuit portion, the first circuit portion being on a first level of an integrated circuit, detecting a second voltage value at a second node of the first cell, and, based on a determined difference between the first voltage value and the second voltage value being greater than a predetermined threshold value, instructing a second cell to supply a voltage to the first cell. The second cell belongs to a second circuit portion on a second level different from the first level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first circuit portion on a first level, the first circuit portion comprising a first cell configured to have a first voltage value at a first node and a second voltage value at a second node; and
   a second circuit portion on a second level different from the first level, the second circuit portion comprising a second cell coupled with the first cell, the second cell being selectively controllable to supply a voltage to the first cell based on an instruction to supply the voltage, wherein the instruction to supply the voltage is based on a determined mismatch between the first voltage value and the second voltage value being greater than a predetermined threshold value.

2. The integrated circuit of claim 1, wherein the first cell comprises a bit cell.

3. The integrated circuit of claim 1, wherein the first cell comprises a sense amplifier.

4. The integrated circuit of claim 3, wherein the first cell further comprises a bit cell.

5. The integrated circuit of claim 1, wherein the integrated circuit is configured to apply the voltage to at least one of the first node or the second node.

6. The integrated circuit of claim 1, wherein the second cell comprises a transistor configured to be selectively turned on or off to supply the voltage to the first cell.

7. The integrated circuit of claim 1, wherein the first cell comprises a transistor configured to receive the voltage, and the voltage changes a voltage ratio of the transistor.

8. The integrated circuit of claim 1, wherein the first circuit portion has a first surface area in a first plane and the second circuit portion has a second surface area in a second plane parallel to the first plane.

9. The integrated circuit of claim 1, wherein the first cell of the first circuit portion has a layout in compliance with a first set of process design rules and the second cell of the second circuit portion has a layout in compliance with a second set of process design rules.

10. The integrated circuit of claim 1, wherein the second level comprises a decoder configured to select the second cell.

11. An apparatus comprising:
a memory including computer program code for one or more programs; and
a processor configured to execute an instruction from the memory to cause the apparatus to:
detect a first voltage value at a first node of a first cell of a first circuit portion, the first circuit portion being on a first level of an integrated circuit;
detect a second voltage value at a second node of the first cell; and
based on a determined mismatch between the first voltage value and the second voltage value being greater than a predetermined threshold value, instruct a second cell to supply a voltage to the first cell, the second cell belonging to a second circuit portion on a second level different from the first level.

12. The apparatus of claim 11, wherein instructing the second cell to supply the voltage comprises selecting the second cell with a decoder.

13. The apparatus of claim 11, wherein instructing the second cell to supply the voltage to the first cell comprises supplying the voltage to at least one of the first node or the second node.

14. The apparatus of claim 11, wherein the first cell comprises at least one of a bit cell or a sense amplifier.

15. A method comprising:
detecting a first voltage value at a first node of a first cell of a first circuit portion, the first circuit portion being on a first level of an integrated circuit;
detecting a second voltage value at a second node of the first cell; and
based on a determined difference between the first voltage value and the second voltage value being greater than a predetermined threshold value, instructing a second cell to supply a voltage to the first cell, the second cell belonging to a second circuit portion on a second level different from the first level.

16. The method of claim 15, wherein supplying the voltage to the first cell changes a voltage ratio of a transistor of the first cell.

17. The method of claim 15, wherein supplying the voltage to the first cell increases a voltage threshold value of the first circuit portion.

18. The method of claim 15, wherein supplying the voltage to the first cell reduces a minimum operating voltage value of the first circuit portion.

19. The method of claim 15, wherein supplying the voltage to the first cell causes the mismatch between the first voltage value and the second voltage value to be less than the predetermined threshold value.

20. The method of claim 15, wherein supplying the voltage to the first cell comprises supplying the voltage to at least one of a bit cell or a sense amplifier.

* * * * *